US010017874B2

United States Patent
Kijima et al.

(10) Patent No.: US 10,017,874 B2
(45) Date of Patent: Jul. 10, 2018

(54) FERROELECTRIC CRYSTAL FILM, ELECTRONIC COMPONENT, MANUFACTURING METHOD OF FERROELECTRIC CRYSTAL FILM, AND MANUFACTURING APPARATUS THEREFOR

(71) Applicants: YOUTEC CO., LTD., Chiba (JP); SAE Magnetics (H.K.) Ltd., Hong Kong (CN)

(72) Inventors: Takeshi Kijima, Chiba (JP); Yuuji Honda, Chiba (JP); Daisuke Iitsuka, Hong Kong (CN); Kenjirou Hata, Hong Kong (CN)

(73) Assignees: YOUTEC CO., LTD., Chiba (JP); SAE MAGNETICS (H.K.) LTD., Shatin, N.T. (HK)

( * ) Notice: Subject to any disclaimer, the term of this patent is extended or adjusted under 35 U.S.C. 154(b) by 0 days.

(21) Appl. No.: 13/690,263

(22) Filed: Nov. 30, 2012

(65) Prior Publication Data

US 2013/0323534 A1    Dec. 5, 2013

(30) Foreign Application Priority Data

Jun. 4, 2012   (JP) .................................. 2012-127046

(51) Int. Cl.
  *C30B 1/02*   (2006.01)
  *C30B 23/08*  (2006.01)
  (Continued)

(52) U.S. Cl.
  CPC ................ *C30B 1/023* (2013.01); *C30B 7/06* (2013.01); *C30B 23/02* (2013.01); *C30B 23/08* (2013.01);
  (Continued)

(58) Field of Classification Search
  None
  See application file for complete search history.

(56) References Cited

U.S. PATENT DOCUMENTS 6,333,066 B1 *  12/2001  Kim ........................... 427/126.3
2002/0076875 A1 *  6/2002  Wasa et al. ................... 438/207
(Continued)

FOREIGN PATENT DOCUMENTS

JP          6-89986         3/1994
JP       06089986_MT    *   3/1994
(Continued)

OTHER PUBLICATIONS

Shao et.al. J. Phys. D: Appl. Phys. 40, 2007, 3793-3797.*
(Continued)

*Primary Examiner* — Vera Katz
(74) *Attorney, Agent, or Firm* — Wenderoth, Lind & Ponack, L.L.P.

(57) ABSTRACT

There is provided a manufacturing method of a ferroelectric crystal film in which an orientation of a seed crystal film is transferred preferably and a film deposition rate is suitable for volume production.
A seed crystal film is formed on a substrate in epitaxial growth by a sputtering method, an amorphous film including ferroelectric material is formed over the seed crystal film by a spin-coat coating method, the seed crystal film and the amorphous film are heated in an oxygen atmosphere for oxidation and crystallization of the amorphous film, and thereby a ferroelectric coated-and-sintered crystal film is formed.

6 Claims, 9 Drawing Sheets

(51) Int. Cl.
    C30B 29/22    (2006.01)
    C30B 29/68    (2006.01)
    C30B 7/06     (2006.01)
    C30B 23/02    (2006.01)
    H01L 41/318   (2013.01)
    H01L 41/319   (2013.01)

(52) U.S. Cl.
    CPC ............ *C30B 29/22* (2013.01); *C30B 29/68* (2013.01); *H01L 41/318* (2013.01); *H01L 41/319* (2013.01); *Y10T 117/10* (2015.01)

(56) References Cited

U.S. PATENT DOCUMENTS

| | | | |
|---|---|---|---|
| 2003/0133250 A1* | 7/2003 | Norga et al. | 361/311 |
| 2007/0132088 A1* | 6/2007 | Kariya | H01L 23/49822 257/698 |
| 2008/0024910 A1* | 1/2008 | Seigler | 360/110 |
| 2010/0147789 A1* | 6/2010 | Kurachi et al. | 216/13 |
| 2010/0182730 A1* | 7/2010 | Beelen | H01G 7/06 361/281 |

FOREIGN PATENT DOCUMENTS

| | | |
|---|---|---|
| JP | 2007-335437 | 12/2007 |
| JP | 2007335437_MT | * 12/2007 |
| WO | 2006/087777 | 8/2006 |

OTHER PUBLICATIONS

Yang et. al. J. Microelectromechanical Sys. 15, No. 5, 2006, 1214-1225.*
Wang et.al. Journal of Applied Physics, 101, 2007, 1-3.*
Auciello et. al. Science and Technology of Electroceramic Thin Films, Jun. 20-24, 1994, 455 p.*
Tan et. al. Appl. Phys. Lett., 75, 48, 1999.*
Office Action dated Jan. 21, 2014 in corresponding Japanese patent application No. 2012-127046 with partial English translation.

* cited by examiner

XRD PATTERN OF CONVENTIONAL SOL-GEL PZT

FERROELECTRIC CRYSTAL FILM, ELECTRONIC COMPONENT, MANUFACTURING METHOD OF FERROELECTRIC CRYSTAL FILM, AND MANUFACTURING APPARATUS THEREFOR

BACKGROUND OF THE INVENTION

Field of the Invention

The present invention relates to a ferroelectric crystal film including a seed crystal film, an electronic component, a manufacturing method of the ferroelectric crystal film, and a manufacturing apparatus therefor.

Description of a Related Art

<Manufacturing Method of a Ferroelectric Crystal Film Using Epitaxial Growth>

FIG. 12 is a cross-sectional view for explaining a conventional manufacturing method of a ferroelectric crystal film.

A Pt film 102 having an orientation in (100) is formed over a substrate 101 such as a 4-inch wafer. Successively, a Pb(Zr, Ti)O$_3$ film (hereinafter, called a "PZT film") 103 is grown epitaxially over this Pt film 102 by a sputtering method. An example of the sputtering condition at this time is as follows.

[Sputtering Condition]
- Apparatus: RF magnetron sputtering apparatus
- Power: 1,500 W
- Gas: Ar/O$_2$
- Pressure: 0.14 Pa
- Temperature: 600° C.
- Film deposition rate: 0.63 nm/sec
- Film deposition time: 53 min By the above epitaxial growth, the PZT film 103 is formed over the Pt film 102 having a thickness of 2 μm. This PZT film 103 has a preferred orientation in (001) as shown in FIG. 13 and has an extremely preferable crystalline property.

In the above conventional manufacturing method of the ferroelectric crystal film, the film deposition rate of the epitaxial growth by the sputtering is low, and therefore the film deposition time becomes long and this method is not suitable for volume production.

Further, the temperature in the sputtering is as high as 600° C., and therefore a vacuum chamber of the apparatus needs to be kept at a high temperature for a long time and a heavy load is applied to the apparatus.

Further, it is known generally that the PZT film deposited by the epitaxial growth has a large leak current density, and therefore withstand voltage is low.

<Manufacturing Method of a Ferroelectric Crystal Film Using a Spin-Coat Coating Method in which a Precursor Solution is Used>

Next, another conventional manufacturing method of the ferroelectric crystal film will be explained (e.g., refer to Patent Document 1 (WO2006/087777)). This another conventional manufacturing method of the ferroelectric crystal film forms the PZT crystal film 103 shown in FIG. 12 by a spin-coat coating method, not by the sputtering method. Details will be explained below.

A PZT precursor solution is spin-coated on the Pt film 102 by a spin coater. At this time, the spin-coater is spun at 1,500 rpm for 20 sec after spinning at 500 rpm for 5 sec. The PZT precursor solution is a precursor solution containing a metal compound including some or all the component metals of the PZT crystal and partial polycondensate thereof in an organic solvent, and a solution having a PZT concentration of 25 weight % (Zr/Ti=52/48) and including 20%-excessive Pb.

Successively, this coated PZT precursor solution is heated on a hot plate to 250° C. and kept at this temperature for 30 sec to be dried for water removal, and then further heated to 450° C. on the hot plate which is kept at a high temperature, and kept at this temperature for 60 sec for temporary calcination.

The above spin coating, drying, and temporary calcination are repeated five times and a five-layer PZT amorphous film is formed.

Successively, annealing processing is performed for the PZT amorphous film after the temporary calcination by keeping the PZT amorphous film at a temperature of 700° C. for 3 min in an oxygen atmosphere of 10 atm using a pressure-type lamp annealing apparatus (RTA: Rapid Thermal Anneal), and thereby PZT crystallization is performed. This crystallized PZT film has a perovskite structure, and the film deposition rate is 2.65 nm/sec including the PZT crystallization from the spin coating of the PZT precursor solution and the film deposition time is 13 min.

The PZT crystal film is formed having a thickness of 2 μm on the Pt film by the spin-coat coating method using the above precursor solution, and this PZT crystal film has orientations in (001) and (110) as shown in FIG. 14.

Although the (001) orientation and the (110) orientation are detected in the PZT crystal film manufactured using the above method and the (100) orientation of the foundation Pt film is not transferred completely, the spin-coat coating method has an advantage that basically a coating capability does not depend so much on a wafer size and this method is easily accommodated to large area coating by a slight change of a coating condition, and therefore the spin-coat coating method is a coating method suitable for volume production. On the other hand, the PZT crystal film by the above epitaxial growth, while having an advantage that the (100) orientation of the foundation Pt film transferred completely, has a considerably low film deposition rate compared to the spin-coat coating method and therefore has a problem to be solved for volume production.

SUMMARY OF THE INVENTION

Problem to be Solved by the Invention

An aspect of the present invention aims to provide a ferroelectric crystal film preferably transferring an orientation of a seed crystal film or an electronic component including the ferroelectric crystal film.

Further, an aspect of the present invention aims to provide a manufacturing method of the ferroelectric crystal film and a manufacturing apparatus therefor, each of which has a film deposition rate suitable for volume production.

Means for Solving the Problem

In the following, various aspects of the present invention will be explained.

[1] A ferroelectric crystal film, comprising:
a ferroelectric seed crystal film formed on a substrate by a sputtering method and having an orientation in a predetermined face; and
a ferroelectric coated-and-sintered crystal film formed over the above ferroelectric seed crystal film, in which
the ferroelectric coated-and-sintered crystal film is formed by a process that a solution, which contains a metal compound including some or all the component metals of the ferroelectric coated-and-sintered crystal film and partial polycondensate thereof (precursor) in an organic solvent, is coated, heated, and crystallized.

[2] The ferroelectric crystal film according to above [1], in which the ferroelectric coated-and-sintered crystal film orientation in the same face as the predetermined face.

[3] The ferroelectric crystal film according to [1] or [2], in which each of ferroelectric seed crystal film and the ferroelectric coated-and-sintered crystal film is a Pb(Zr, Ti)O$_3$ film or a (Pb, A)(Zr, Ti)O$_3$ film, and A is configured with at least one kind selected from the group consisting of Li, Na, K, Rb, Ca, Sr, Ba, Bi, and La.

[4] The ferroelectric crystal film according to [3], in which a Zr/Ti ratio in the number of elements for the Pb(Zr, Ti)O$_3$ film or (Pb, A)(Zr, Ti)O$_3$ film satisfies the following formula (1).

$$60/40 \geq Zr/Ti \geq 40/60 \qquad (1)$$

[5] The ferroelectric crystal film according to [3] or [4], in which each ratio in the number of elements for the Pb(Zr, Ti)O$_3$ film satisfies the following formula (2) and each ratio in the number of elements for the (Pb, A)(Zr, Ti)O$_3$ film satisfies the following formula (3).

$$Pb/(Zr+Ti) < 1.06 \qquad (2)$$

$$(Pb+A)/(Zr+Ti) \leq 1.35 \qquad (3)$$

[6] The ferroelectric crystal film according to any one of [3] to [5], in which the ferroelectric seed crystal film has an orientation in (001), and the ferroelectric coated-and-sintered crystal film has an orientation in (001).

[7] The ferroelectric crystal film according to any one [3] to [5], in which the ferroelectric seed crystal film has an orientation in (111), and the ferroelectric coated-and-sintered crystal film has an orientation in (111).

[8] An electronic component, comprising the ferroelectric crystal film according to any one of [1] to [7].

[9] A manufacturing method of a ferroelectric crystal film, comprising the steps of:

forming a ferroelectric seed crystal film having an orientation in a predetermined face over a substrate in epitaxial growth by a sputtering method;

forming an amorphous precursor film over the ferroelectric seed crystal film by a method of coating a solution which contains a metal compound including some or all the component metals of the ferroelectric seed crystal film and partial polycondensate thereof in an organic solvent; and heating the ferroelectric seed crystal film and amorphous precursor film in an oxygen atmosphere to oxidize and crystallize the amorphous precursor film, and thereby forming a ferroelectric coated-and-sintered crystal film.

[10] The manufacturing method of a ferroelectric crystal film according to [9], in which the ferroelectric coated-and-sintered crystal film has an orientation in the same face as the predetermined face.

[11] The manufacturing method of a ferroelectric crystal film according to [9] or [10], in which each of the ferroelectric seed crystal film and the ferroelectric coated-and-sintered crystal film is a Pb(Zr, Ti)O$_3$, film or a (Pb, A)(Zr, Ti)O$_3$ film and A is configured with at least one kind selected from the group consisting of Li, Na, K, Rb, Ca, Sr, Ba, Bi, and La.

[12] The manufacturing method of a ferroelectric crystal film according to [11], in which a Zr/Ti ratio in the number of elements for the Pb(Zr, Ti)O$_3$ film or (Pb, A)(Zr, Ti)O$_3$ film satisfies the following formula (1).

$$60/40 \geq Zr/Ti \geq 40/60 \qquad (1)$$

[13] The manufacturing method of a ferroelectric crystal film according to [11] or [12], in which each ratio in the number of elements for the Pb(Zr, Ti)O$_3$ film satisfies the following formula (2) and each ratio in the number of elements for the (Pb, A)(Zr, Ti)O$_3$ film satisfies the following formula (3).

$$Pb/(Zr+Ti) < 1.06 \qquad (2)$$

$$(Pb+A)/(Zr+Ti) \leq 1.35 \qquad (3)$$

[14] The manufacturing method of a ferroelectric crystal film according to any one of [11] to [13], in which the ferroelectric seed crystal film has an orientation in (001), and the ferroelectric coated-and-sintered crystal film has an orientation in (001).

[15] The manufacturing method of a ferroelectric crystal film according to any one of [11] to [13], in which the ferroelectric seed crystal film has an orientation in (111), and the ferroelectric coated-and-sintered crystal film has an orientation in (111).

[16] A manufacturing apparatus for a ° electric crystal film, comprising:

a first apparatus forming a ferroelectric seed crystal film having an orientation in a predetermined face over a substrate in epitaxial growth by a sputtering method;

a second apparatus performing coating to form an amorphous film including ferroelectric material over the ferroelectric seed crystal film by a spin-coat coating method; and a third apparatus heating the ferroelectric seed crystal film and the amorphous film in an oxygen atmosphere to oxidize and crystallize the amorphous film, and thereby forming a ferroelectric coated-and-sintered crystal film.

[17] The manufacturing apparatus for a ferroelectric crystal film according to [16], in which the ferroelectric coated-and-sintered crystal film has an orientation the same face as the predetermined face.

[18] The manufacturing apparatus for a ferroelectric crystal film according to [16] or [17], in which each of the ferroelectric seed crystal film and the ferroelectric coated-and-sintered crystal film is a Pb(Zr, Ti)O$_3$ film or a (Pb, A)(Zr, Ti)O$_3$ film and A is configured with at least one kind selected from the group consisting of Li, Na, K, Rb, Ca, Sr, Ba, Bi, and La.

[19] The manufacturing apparatus for a ferroelectric crystal film according to [18], in which a Zr/Ti ratio in the number of elements for the Pb(Zr, Ti)O$_3$ film or (Pb, A)(Zr, Ti)O$_3$ film satisfies the following formula (1).

$$60/40 \geq Zr/Ti \geq 40/60 \qquad (1)$$

[20] The manufacturing apparatus for a ferroelectric crystal film according to [18] or [19], in which each ratio in the number of elements for the Pb(Zr, Ti)O$_3$ film satisfies the following formula (2) and each ratio in the number of elements for the (Pb, A)(Zr, Ti)O$_3$ film satisfies the following formula (3).

$$Pb/(Zr+Ti)<1.06 \qquad (2)$$

$$(Pb+A)/(Zr+Ti)\leq 1.35 \qquad (3)$$

[21] The manufacturing apparatus for a ferroelectric crystal according to any one of [18] to [20], in which
the ferroelectric seed crystal film has an orientation in (001), and
the ferroelectric coated-and-sintered crystal film has an orientation in (001).
[22] The manufacturing apparatus for a ferroelectric crystal film according to any one of [18] to [20], in which
the ferroelectric seed crystal film has an orientation in (111), and
the ferroelectric coated-and-sintered crystal film has an orientation in (111).

By applying an aspect of the present invention, it is possible to provide a ferroelectric crystal film preferably transferring an orientation of a seed crystal film or an electronic component including the ferroelectric crystal film.

Further, by applying an aspect of the present invention, it is possible to provide a manufacturing method of the ferroelectric crystal film and a manufacturing apparatus for the ferroelectric crystal film, each of which has a film deposition rate suitable for volume production.

DESCRIPTION OF THE PREFERRED EMBODIMENTS

In the following, an embodiment of the present invention will be explained in detail by the use of the drawings. Note that the present invention is not limited to the following explanation, and it is easily understood by those skilled in the art that aspects and details of the present invention can be changed variously without departing from the gist and the scope thereof. Accordingly, the present invention is not construed to be limited to the description contents of the embodiment shown in the following.

Figure 1:
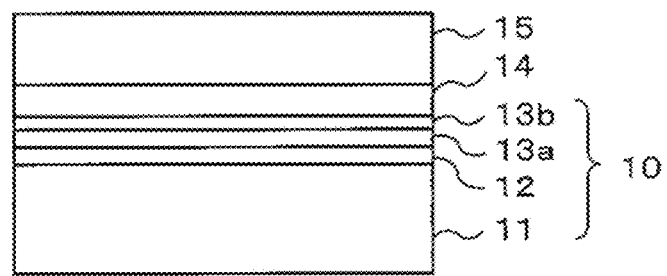
FIG. 1 is a cross-sectional view for explaining a manufacturing method of a ferroelectric crystal film according to an aspect of the present invention.
Figure 2:
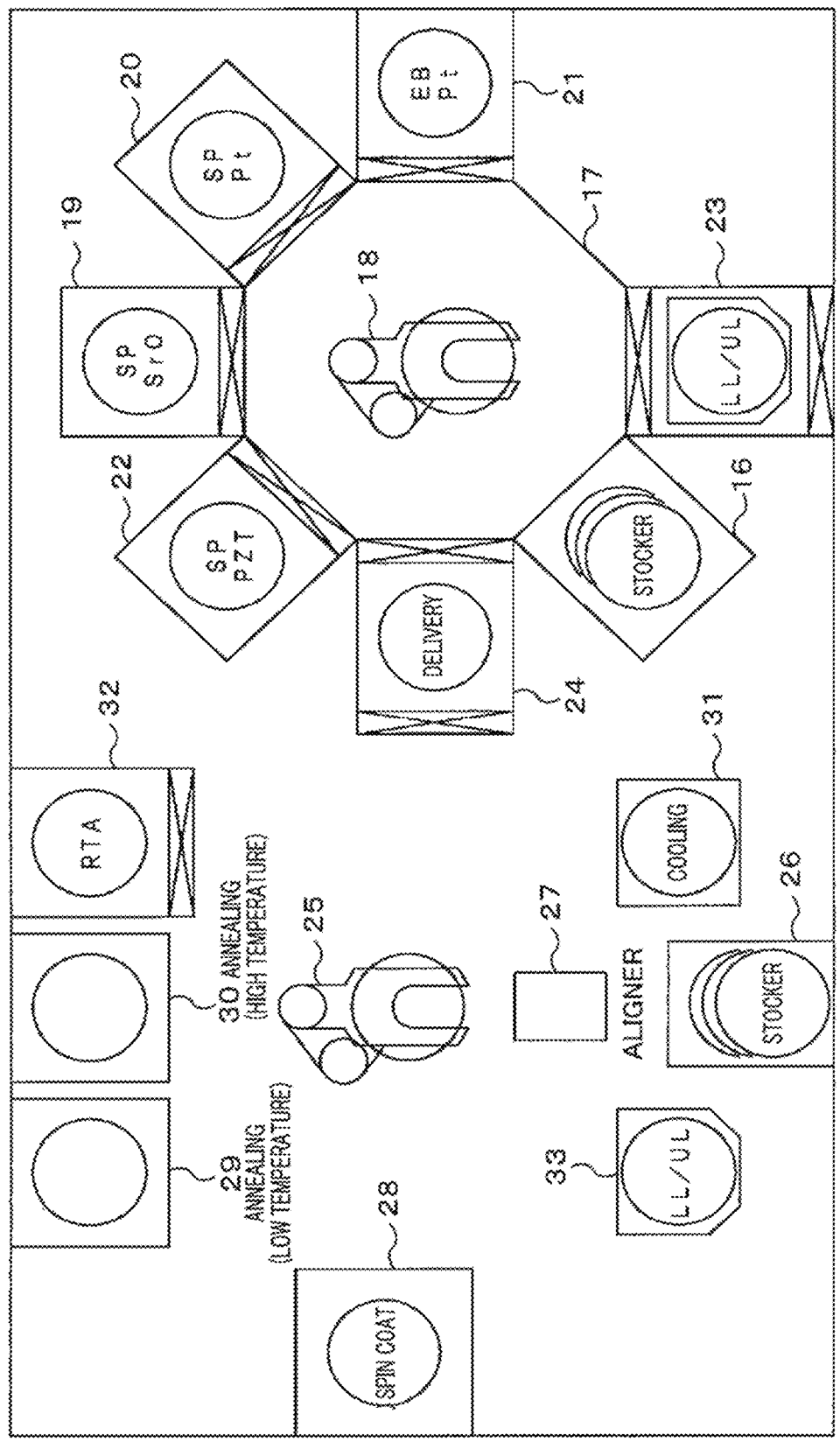
FIG. 2 is a configuration diagram schematically showing a manufacturing apparatus for a ferroelectric crystal film according to an aspect of the present invention.

FIG. 1 is a cross-sectional view for explaining a manufacturing method of a ferroelectric crystal film according to an aspect of the present invention. FIG. 2 is a configuration diagram schematically showing a manufacturing apparatus for a ferroelectric crystal film according to an aspect of the present invention. This manufacturing apparatus for the ferroelectric crystal film is a composite film deposition apparatus for forming a ferroelectric capacitor.

First, a substrate 10 is prepared.

In detail, a silicon wafer 11 is introduced from the outside of the apparatus into a load/unload chamber 23 shown in FIG. 2, and the silicon wafer 11 in the load/unload chamber 23 is transferred by a transfer robot 18 to a stocker 16 through a transfer chamber 17. Successively, the silicon wafer 11 in the stocker 16 is transferred by the transfer robot 18 to an electron beam evaporation apparatus 21 through the transfer chamber 17. Next, an oxide film is deposited over the silicon wafer 11 by the electron beam evaporation apparatus 21. Contiguously, a Pt film is deposited having an orientation in (100) and then a film 12 is obtained. Successively, the silicon wafer 11 in the electron beam evaporation apparatus 21 is transferred by the transfer robot 18 to a first sputtering apparatus 20 through the transfer chamber 17. Next, a Pt film 13a having an orientation in (100) is deposited over the Pt film by the first sputtering apparatus 20. Successively, the silicon wafer 11 in the first sputtering apparatus 20 is transferred by the transfer robot 18 to a second sputtering apparatus 19 through the transfer chamber 17. Next, a SrRuO$_3$ film 13b having an orientation in (001) is deposited over the Pt film 13a having an orientation in (100) by the second sputtering apparatus 19.

Next, the substrate 10 in the second sputtering apparatus 19 is transferred by the transfer robot 18 to the third sputtering apparatus 22 through the transfer chamber 17. Next, a ferroelectric seed crystal film 14 is formed in epitaxial growth by sputtering over the SrRuO$_3$ film 13b of the substrate 10 by the use of the third sputtering apparatus 22.

As a specific example of the ferroelectric seed crystal film 14, there is preferably used a Pb(Zr, Ti)O$_3$ film or a (Pb, A)(Zr, Ti)O$_3$ film, in which a Zr/Ti ratio in the number of elements satisfies the following formula (1), for example. Preferably, A is configured with at least one kind selected from the group consisting of Li, Na, K, Rb, Ca, Sr, Ba, Bi, and La.

$$60/40 \geq Zr/Ti \geq 40/60 \qquad (1)$$

Each ratio in the number of elements for the Pb(Zr, Ti)O$_3$ film satisfies the following formula (2) and preferably satisfies the following formula (2').

$$Pb/(Zr+Ti)<1.06 \qquad (2)$$

$$1 \leq Pb/(Zr+Ti) < 1.06 \qquad (2')$$

Each ratio in the number of elements for $(Pb, A)(Zr, Ti)O_3$ film satisfies the following formula (3) and preferably satisfies the following formula (3').

$$(Pb+A)/(Zr+Ti) \leq 1.35 \qquad (3)$$

$$1 \leq (Pb+A)/(Zr+Ti) \leq 1.35 \qquad (3')$$

By using the $Pb(Zr, Ti)O_3$ film or the $(Pb, A)(Zr, Ti)O_3$ film formed by the above epitaxial growth, it is possible to form a ferroelectric seed crystal film 14 having a single orientation or a preferred orientation in either (001) or (111) and also having an extremely preferable crystalline property.

After that, an amorphous film including ferroelectric material is formed over the ferroelectric seed crystal film 14 by a spin-coat coating method using a precursor solution, and the ferroelectric seed crystal film 14 and the amorphous film are heated in an oxygen atmosphere for oxidation and crystallization of the amorphous film, and thereby a ferroelectric coated-and-sintered crystal film 15 is formed.

In the following, details will be explained.

The substrate 10 in the third sputtering apparatus 22 is transferred by the transfer robot 18 to a delivery chamber 24 through the transfer chamber 17. Successively, the substrate 10 in the delivery chamber 24 is transferred by a transfer robot 25 to a stocker 26.

Successively, the substrate 10 in the stocker 26 is transferred by the transfer robot 25 to an aligner 27, and the aligner 27 performs processing of detecting the center position in the surface of the substrate 10. The purpose of this processing is that, by the use of the detected center position of the substrate surface, the center position of the substrate surface and the spin center of the substrate are caused to come together with each other in spin coat processing.

After that, the substrate 10 in the aligner 27 is transferred by the transfer robot 25 to a spin coat chamber 28. Successively, in the spin coat chamber 28, a step of coating a film over the ferroelectric seed crystal film 14 of the substrate 10 is performed by spin coating.

This step will be explained in detail below.

The substrate 10 is spun while a cleaning solution is supplied onto the substrate 10 by a cleaning nozzle. Thereby, the surface of the substrate 10 is cleaned. Next, the supply of the cleaning solution is stepped and the cleaning solution remaining over the substrate 10 is removed by spinning of the substrate 10.

Next, the substrate 10 is spun while chemical material is dripped onto the substrate 10 by a drip nozzle. At the same time, a cleaning solution is dripped onto the surface edge part of the substrate 10 by an edge rinse nozzle. Thereby, a ceramics precursor film is coated over the substrate 10. The reason why the cleaning solution is dripped onto the surface edge part of the substrate is that, when the film is coated over the substrate 10 by the spin coating, the film thickness becomes larger at the edge part of the substrate 18 than in the center part of the substrate 10 and therefore the coating is performed while the film at the edge part of the substrate 10 is removed by the cleaning solution. Accordingly, it is preferable to shift a position where the cleaning solution is dripped little by little from the edge part to the center side of the substrate 10, by shifting the edge rinse nozzle little by little from the edge part to the center side of the substrate 10.

Successively, the substrate 10 in the spin coat chamber 28 is transferred by the transfer robot 25 to an annealing apparatus 29, and a step of drying processing is performed for the ceramics precursor film over the substrate 10 by the annealing apparatus 29.

This step will be explained in detail below.

The substrate is heated to 200 to 250° C., for example, by a hot plate while air on the surface of the film coated over the substrate 10 is exhausted by an exhaust mechanism. Thereby, water or the like is removed from the ceramics precursor film.

After that, the substrate 10 in the annealing apparatus 29 is transferred by the transfer robot 25 to an annealing apparatus 30, and a step of providing temporary calcination is performed for the ceramics precursor film over the substrate 10 in the annealing apparatus 30.

In detail, after the inside of a temporary calcination processing chamber in the annealing apparatus 30 has been exhausted to vacuum by an exhaust system, the inside of the temporary calcination processing chamber is caused to have a vacuum atmosphere, a nitrogen atmosphere, or an inert gas atmosphere at a normal pressure by a gas introduction mechanism, and the temporary calcination is performed by heating the ceramics precursor film over the substrate 10 at a desired temperature (e.g., 300° C. to 600° C.) by a lamp heater.

After that, the substrate 10 in the temporary calcination processing chamber of the annealing apparatus 30 is transferred by the transfer robot 25 to a cooling apparatus 31, and the substrate 10 is cooled to a predetermined temperature in the cooling apparatus 31.

After that, the substrate 10 in the cooling apparatus 31 is transferred by the transfer robot 25 to the aligner 27, and the aligner 27 performs the processing of detecting the center position in the surface of the substrate 10.

After that, the substrate 10 in the aligner 27 is transferred by the transfer robot 25 to the spin coat chamber 28.

After that, plural ceramics precursor films are formed in a stacked manner over the ferroelectric seed crystal film 14 of the substrate 10, by a process of repeating the steps of the spin coat processing, the drying processing, and the temporary calcination processing in plural times (e.g., 30 times) by the same method as that described above. By such repeating in more times, a thicker film (e.g., thickness of 1 μm or larger) can be formed over the ferroelectric seed crystal film 14. In this case, it is possible to improve productivity by using the manufacturing apparatus for the ferroelectric crystal film shown in FIG. 2. In detail, by operating the manufacturing apparatus for the ferroelectric crystal film as described above by a control section (not shown in the drawing), it is possible automatically to perform the sputtering film deposition processing, the electron beam evaporation processing, the spin coat processing, the drying processing, and the temporary calcination processing. When respective processing steps performed individually and the substrate 10 is transferred by operator's hands, there might be concern that the hands become numb, the processing order is wrong, or the substrate 10 is dropped during the transfer. In this case, however, there is an advantage that such problems do not occur. Accordingly, it is possible to improve productivity in volume production and to improve yield.

After that, the substrate 10 in the temporary calcination processing chamber of the annealing apparatus 30 is transferred by the transfer robot 25 to a pressure type lamp annealing apparatus 32. Here, the transfer time of the substrate 10 from the temporary calcination processing chamber to the pressure type lamp annealing apparatus 32 is preferably not longer than 10 sec.

The reason why the transfer time needs to be short is as follows. A longer transfer time considerably affects the characteristics of the ferroelectric crystal film. In detail, after the temporary calcination, the ceramics precursor film has a very high oxygen activity to have an oxygen deficiency state, and therefore the ceramics precursor film is coupled with oxygen in the air and the film characteristics are deteriorated. Accordingly, the transfer time is preferably shorter.

After that, the pressure type lamp annealing apparatus 32 performs a step of providing lamp annealing processing for the plural chemical material film layers over the substrate 10.

In detail, the ferroelectric seed crystal film 14 and the amorphous film which is the ceramics precursor film are heated in an oxygen atmosphere. Thereby, a ferroelectric coated-and-sintered crystal film 15 can be formed by oxidation and crystallization of the amorphous film. Here, the ferroelectric seed crystal film 14 and the amorphous film may be heated in a pressured oxygen atmosphere, and preferably may be heated in a pressured oxygen atmosphere at not lower than 4 atm. Thereby, it is possible to obtain a ferroelectric crystal film having a stronger single orientation.

After that, the substrate 10 in an annealing processing chamber of the pressure type lamp annealing apparatus 32 is transferred by the transfer robot 25 to a load/unload chamber 33, and the substrate 10 is taken out from the load/unload chamber 33 to the outside of the apparatus.

Note that, while the amorphous film is formed via the $SrRuO_3$ film and the Pt film over the silicon wafer 11 in the present embodiment, the amorphous film may be formed via another conductive film or an insulating film over the silicon wafer 11.

Further, since the above amorphous film and the ferroelectric seed crystal film 14 contact each other perfectly face to face, crystals having a strong single orientation in the ferroelectric seed crystal film 14 are transferred preferably to the amorphous film, and thereby crystals having a strong single orientation is formed in the amorphous film.

The above ferroelectric coated-and-sintered crystal film 15 has the same orientation as the ferroelectric seed crystal film 14. For example, when the ferroelectric seed crystal film 14 has an orientation in (001), the ferroelectric coated-and-sintered crystal film 15 also comes to have an orientation in (001), and, when the ferroelectric seed crystal film 14 has an orientation in (111), the ferroelectric coated-and-sintered crystal film 15 also comes to have an orientation in (111).

Further, as described above, when the $Pb(Zr, Ti)O_3$ film or the $(Pb, A)(Zr, Ti)O_3$ film is used for the ferroelectric seed crystal film 14, it is possible to cause the ferroelectric seed crystal film 14 easily to have an orientation in (001) by causing the Zr/Ti ratio to satisfy the following formula (5).

$$52/48 < Zr/Ti \leq 40/60 \quad (5)$$

Further, as described above, when the $Pb(Zr, Ti)O_3$ film the $(Pb, A)(Zr, Ti)O_3$ film is used for the ferroelectric seed crystal film 14, it is possible to cause the ferroelectric seed crystal film 14 easily to have an orientation in (111) by causing the Zr/Ti ratio to satisfy the following formula (6).

$$60/40 \leq Zr/Ti < 52/48 \quad (6)$$

The ferroelectric seed crystal film 14 functions as initial nuclei in the crystallization of the amorphous film.

A specific example of the ferroelectric coated-and-sintered crystal film 15 is the $Pb(Zr, Ti)O_3$ film or the $(Pb, A)(Zr, Ti)O_3$ film in which the Zr/Ti ratio in the number of elements satisfies the following formula (4). A may be configured with at least one kind selected from the group consisting of Li, Na, K, Rb, Ca, Sr, Ba, Bi, and La.

$$60/40 \leq Zr/Ti \leq 40/60 \quad (4)$$

According to the present embodiment, it is possible to have a strong single orientation or preferred orientation even in the ferroelectric coated-and-sintered crystal film 15 fabricated by the use of the spin-coat coating method. In detail, it is possible to form the ferroelectric coated-and-sintered crystal film 15 having the same orientation as the ferroelectric seed crystal film 14, by utilizing the ferroelectric seed crystal film 14, which has a single orientation or a preferred orientation and also has an extremely preferable crystalline property, as initial nuclei of the amorphous film and by heating and crystallizing the amorphous film in an oxygen atmosphere.

In other words, it is possible to transfer the preferred orientation of the ferroelectric seed crystal film 14, which has an extremely preferable crystalline property obtained by the epitaxial growth, faithfully to the ferroelectric coated-and-sintered crystal film 15 using the spin-coat coating method. Resultantly, it is possible to obtain the ferroelectric coated-and-sintered crystal film 15 which has a single orientation or a preferred orientation and also a preferable crystalline property.

That is, the ferroelectric coated-and-sintered crystal film 15, which is deposited using the spin-coat coating method over the ferroelectric seed crystal film 14 epitaxially grown by the sputtering method, has the same crystalline structure as the ferroelectric seed crystal film 14. Further, it is possible to control the crystalline structure of the ferroelectric coated-and-sintered crystal film 15 by depositing the ferroelectric coated-and-sintered crystal film 15 over the ferroelectric seed crystal film 14 in which the crystalline structure is defined.

Further, the deposition rate of the ferroelectric coated-and-sintered crystal film 15 using the spin-coat coating method is extremely higher than the deposition rate of the ferroelectric crystal film of the conventional art which is epitaxially grown by the sputtering method. Accordingly, the manufacturing method of the ferroelectric crystal film according to an aspect of the present invention, in which the ferroelectric coated-and-sintered crystal film 15 is formed over the ferroelectric seed crystal film 14 by the use of the spin-coat coating method, has a deposition rate suitable for volume production.

Further, an aspect of the present invention can be applied to an electronic component including the above described ferroelectric crystal film.

Example 1

In the following, the present example will be explained with reference to FIG. 1 and FIG. 3.

An oxide film and a Pt film are deposited over a 4-inch Si wafer 11 by an electron beam evaporation apparatus and a film 12 having an orientation in (100) is obtained.

Next, a Pt film 13a of approximately 100 nm having an orientation in (100) is deposited over the film 12 by a sputtering method.

Next, a $SrRuO_3$ film 13b having an orientation in (001) is deposited over the Pt film 13a by a sputtering method.

Successively, a seed crystal film 14 configured with a $Pb(Zr, Ti)O_3$ film is epitaxially grown over this $SrRuO_3$ film 13b by a sputtering method. A sputtering condition at this time is as follows.

[Sputtering Condition]
 Apparatus: RF magnetron sputtering apparatus
 Power: 1,500 W
 Gas: Ar/$O_2$
 Pressure: 0.14 Pa
 Temperature: 600° C.
 Film deposition rate: 0.63 nm/sec
 Film deposition time: 1.3 min By the above epitaxial growth, the seed crystal film 14 configured with a Pb(Zr, Ti)$O_3$ film having a thickness of 50 nm is formed over the film 13b. This seed crystal film 14 has a preferred orientation in (001) and has an extremely preferable crystalline property.

Next, a PZT precursor solution is prepared. The PZT precursor solution is a precursor solution containing a metal compound including some or all the components metals of a PZT crystal and partial polycondensate thereof in an organic solvent, and a solution having a PZT concentration of 25 weight % (Zr/Ti=52/48) and including 20%-excessive Pb.

Next, the PZT precursor solution is coated by a spin coat method over the seed crystal film 14 and thereby the first coating film is formed overlapping this seed crystal film 14. In detail, the PZT precursor solution of 500 μL is coated over the seed crystal film 14, spin speed is increased from 0 to 500 rpm in 3 sec, the spin speed is kept at 500 rpm for 5 sec, and then spinning is performed at 1,500 rpm for 20 sec and stopped.

Successively, this coated PZT precursor solution is heated to 250° C. on a hot plate and kept at this temperature for 30 sec to be dried, and, after removal of water, the PZT precursor solution is further heated to 450° C. on the hot plate which is kept at a high temperature, and kept at this temperature for 60 sec for temporary calcination.

The above spin coating, drying, and temporary calcination are repeated five times and thereby a five-layer PZT amorphous film is fabricated including the ferroelectric material.

Successively, the PZT amorphous film after the temporary calcination is kept at 700° C. for 3 min for annealing processing in an oxygen atmosphere of 10 atm by the use of a pressure type lamp annealing apparatus (RTA: Rapid Thermal Anneal), and thereby PZT crystallization is performed. This crystallised PZT film is a ferroelectric coated-and-sintered crystal film having a perovskite structure, the thickness is 1.5 μm, the film deposition rate including the spin coating to the crystallization of the sol-gel solution is 2.65 nm/sec, and the film deposition time is 11 min.

The total film deposition time for the above seed crystal film 14 of 0.5 μm which is formed by the epitaxial growth using the sputtering method and the PZT crystal film 15 of 1.5 μm which is formed by the spin-coat coating method is 24 min. This total time has been achieved to be short by the high film deposition rate of the spin-coat coating method compared to the case of the film deposition only by the sputtering method.

Figure 3:
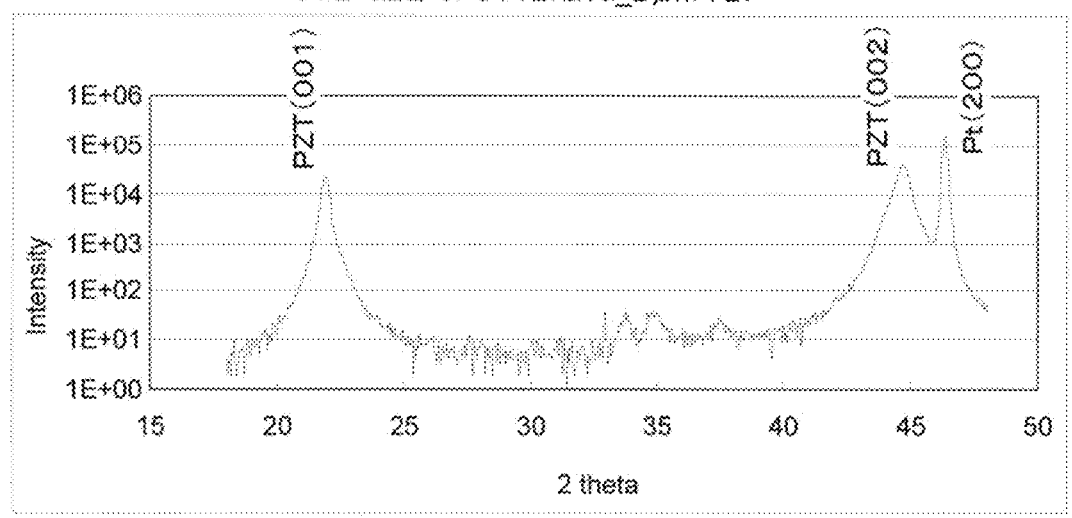
FIG. 3 is a diagram showing a crystalline property evaluation result by XRD diffraction for a PZT film 15 which is formed by the spin-coat coating method shown in FIG. 1.

FIG. 3 is a diagram showing a crystalline property evaluation result by XRD diffraction for the PZT crystal film 15 formed by the spin-coat coating method shown in FIG. 1. The composition ratio of the PZT crystal film is specified as Zr/Ti=52/48.

As shown in FIG. 3, it has been confirmed that even the PZT crystal film 15 formed by the spin-coat coating method has a preferred orientation in (001) and has an extremely preferable crystalline property.

Note that, in the present specification, the precursor solution means any of a sol-gel solution a MOD (Metal Organic Decomposition method) solution, and a mixed solution of the sol-gel solution and the MOD solution.

Details will be explained in the following.

The sol-gel solution is a solution in which metal alkoxide or the like is hydrolyzed and polymerized into a colloidal state and dispersed in an organic solvent solution such as alcohol. In particular, a solution in which a major component thereof forms a ceramics precursor is called a sol-gel solution.

Meanwhile, a solution in which metal organic acid salt is dissolved in an organic solvent is generally called a MOD solution. Typically, acetic acid, octylic acid, hexanoic acid, valeric acid, carboxylic acid, butyric acid, trifluoric acid or the like is used as organic acid.

Further, as in an aspect of the present invention, there are many cases in which the sol-gel solution and the MOD solution are mixed to be used, and, in this case, the solution is named according to determination which is a major component, or the like.

While, as described above, the case for an aspect of the present invention uses a solution in which the both solutions are mixed, since the solution is mostly configured with alkoxide polycondensate (ceramics precursor), the solution, which contains a metal compound including some or all the component metals and partial polycondensate thereof (precursor) in a organic solvent, is called a precursor solution.

Example 2

In the following, the present example will be explained. A ferroelectric crystal film of the present example is deposited by the use of the composite film deposition apparatus shown in FIG. 2.

A ferroelectric seed crystal film is grown epitaxially on a 4-inch Si wafer by the same method as that of example 1. The ferroelectric seed crystal film, which is formed in this manner having a thickness of 50 nm, has a single orientation in (001) and has an extremely preferable crystalline property.

Next, a ferroelectric coated-and-sintered crystal film, which is configured with a PZT thick film having a total thickness of 3.5 μm, is formed overlapping the ferroelectric seed crystal film by spin-coat coating and crystallization under the following condition. Thereby, a sample of the ferroelectric coated-and-sintered crystal film is fabricated, configured with three kinds of film having different compositions; a first layer to a third layer.

[Solution Coating Condition]
 Composition Ratio of a Used Solution
 First layer: Pb/Si/Zr/Ti/Nb=103/12/53/47/0
 Second layer: Pb/Bi/Zr/Ti/Nb=103/0/53/47/0
 Third layer: Pb/Bi/Zr/Ti/Nb=103/12/47/41/12
 Number of Coatings
 First layer: 3
 Second layer: 6
 Third layer: 1
 Film Thickness
 First layer: 900 nm
 Second layer: 1,800 nm
 Third layer: 300 nm
 Total Processing Time (Min)
 First layer: Spin 7.5+RTA 2
 Second layer: Spin 15+RTA 10
 Third layer: Spin 2.5+RTA 3
 Time for One Coating First layer to third layer: Spin coating 1 min+Drying (hot plate 250° C.) 0.5 min+Temporary calcination (hot plate 450° C.) 1 min=2.5 min

[Crystallization Condition]

First layer: RTA temperature elevation, speed 100° C./sec, $O_2$ pressure 1 atm, Temperature 600° C., Burning time 1 min Second layer: RTA temperature elevation speed 100° C./sec. $O_2$ pressure 5 atm, Temperature 600° C., Burning time 10 min Third layer: RTA temperature elevation speed 100° C./sec, $O_2$ pressure 10 atm, Temperature 650° C., Burning time 3 min

[Total Processing Time]

First layer: 9.5 min

Second layer: 25 min

Third layer: 5.5 min

According to the present example, since the ferroelectric seed crystal film exists as initial nuclei, it is possible to cause the crystallization temperature of the ferroelectric coated-and-sintered crystal film to be a comparatively low temperature of approximately 600° C.

Further, in the case of the solution coating method, the coating is possible if material is prepared as the solution. In the present example, excessive Pb is set to 3% and, instead, Bi is added as an additive agent in a relative concentration to Pb of 12%. Note that a problem of the sputtering case that only a sintered material can be used for a sputtering target does not exist in the case of the solution.

Further, while usually excessive Pb of 10% or more necessary in a material solution for the formation of the PZT film, an lead excessive amount is not more than 6% for the total film thickness of the PZT film which is the ferroelectric coated-and-sintered crystal film finally obtained by the present example.

Figure 4:
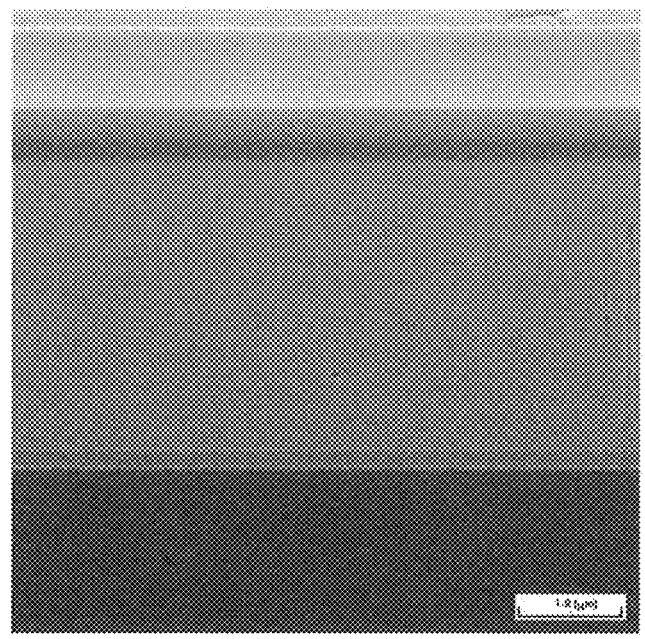
FIG. 4 is a FIB-SEM image showing a sample cross section of example 2.

FIG. 4 is a FIB-SEM image showing a sample cross section in example 2. The composition ratio of the top film is specified as Zr/Ti/Nb=51/45/4. From FIG. 4, it has been confirmed that a dense and smooth high quality PZT film can be obtained having a cap layer of the PZTN thin film with the above composition at the top.

Figure 5:
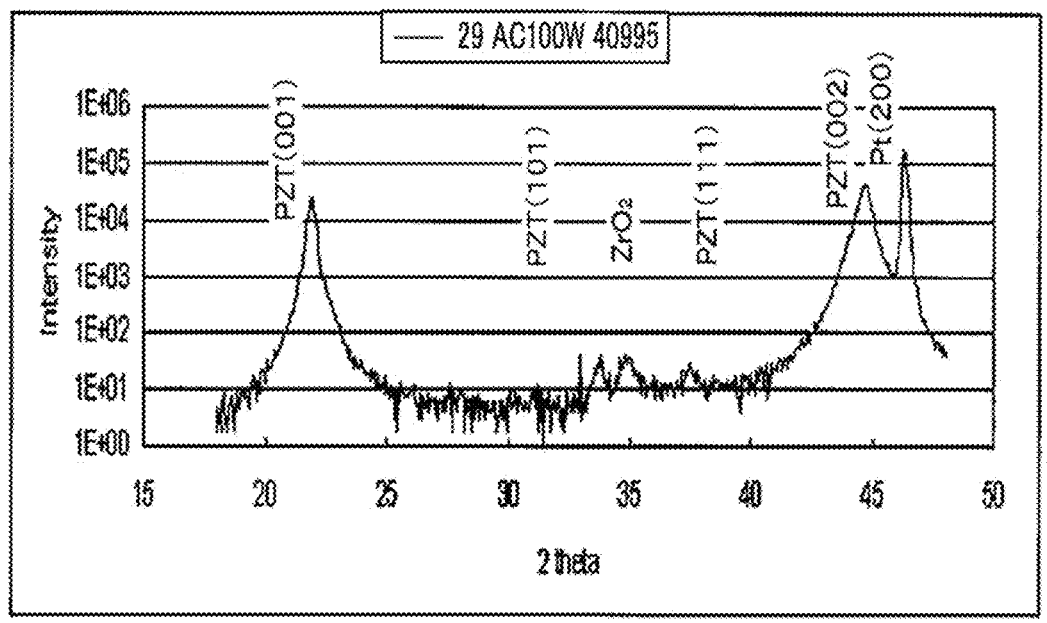
FIG. 5 is a diagram showing a crystalline property evaluation result by XRD diffraction for example 2.
Figure 6:
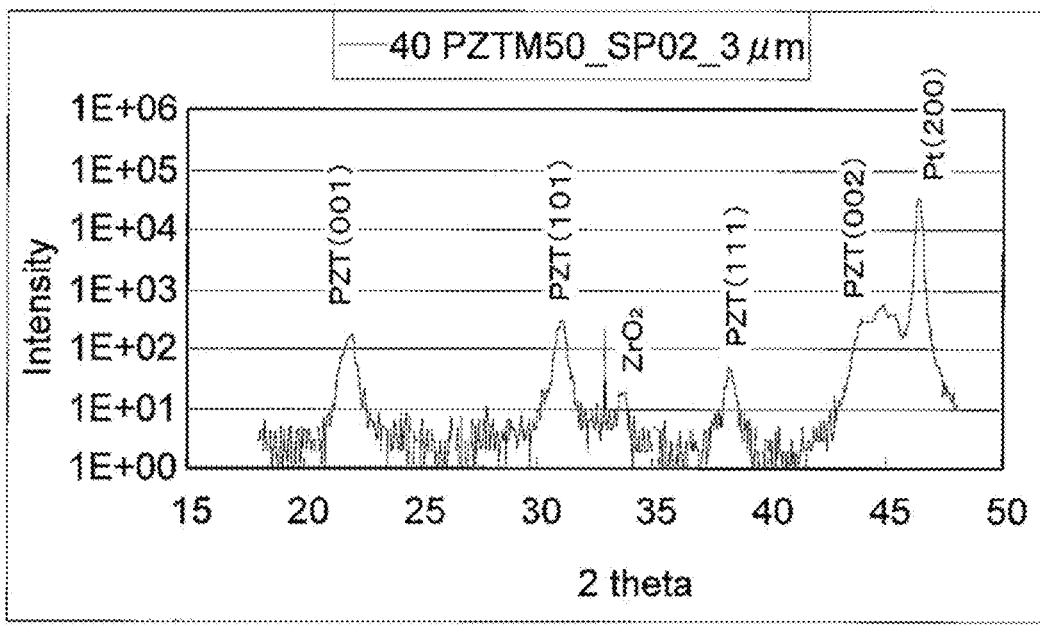
FIG. 6 is a diagram showing a crystalline property evaluation result by XRD diffraction for a conventional ferroelectric coated-and-sintered crystal film which is fabricated in the same condition as that of example 2 except a point that a ferroelectric seed crystal film does not exist.

FIG. 5 is a diagram showing a crystalline property evaluation result by the XRD diffraction for example 2. FIG. 6 is a diagram showing a crystalline property evaluation result by the XRD diffraction for a conventional ferroelectric coated-and-sintered crystal film which is fabricated in the same condition as that of the example 2 except a point that the ferroelectric seed crystal film does not exist.

When an XRD pattern is compared between FIG. 5 and FIG. 6, in the conventional ferroelectric coated-and-sintered crystal film of FIG. 6, only an XRD pattern as shown in FIG. 6 is obtained even if the solution coating condition is the same and the peak intensity is not higher than 1/1,000 of that of the present example shown in FIG. 5, and therefore it has been confirmed that a single orientation is not found although a (001) orientation component is strongest.

According to FIG. 5, it can be confirmed that a preferable epitaxial film has been obtained having a (001) single orientation.

Figure 7:
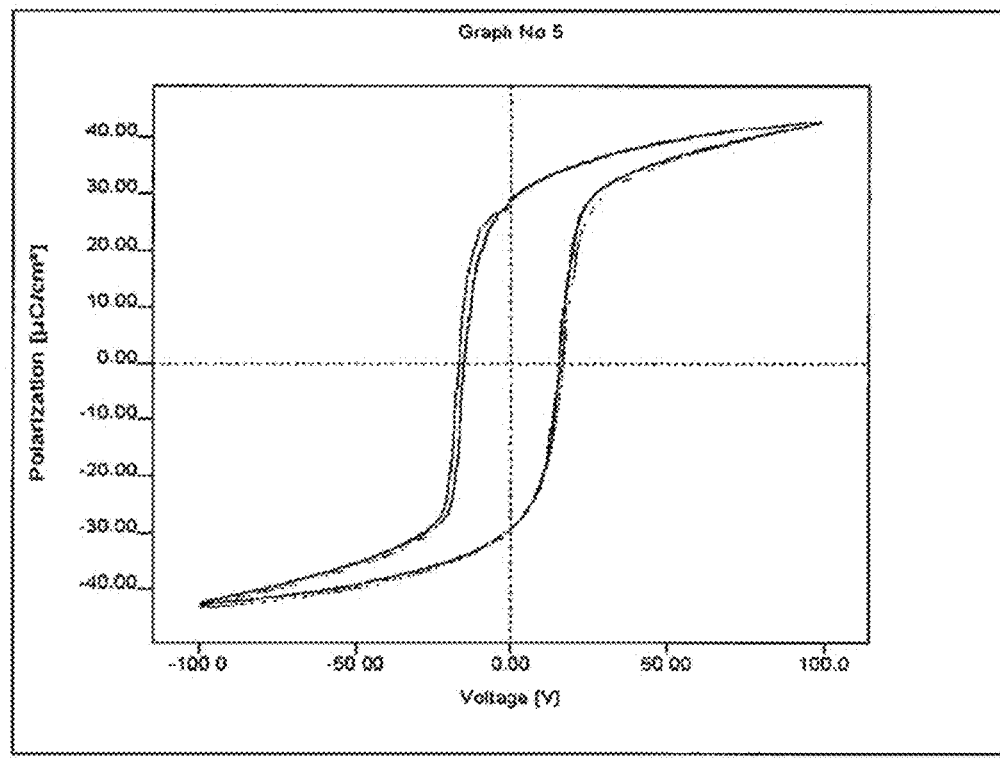
FIG. 7 is a diagram showing a hysteresis evaluation result for example 2.

FIG. 7 is a diagram showing a hysteresis evaluation result for example 2.

According to a PE-hysteresis loop of FIG. 7, it has been confirmed that a hysteresis characteristic is obtained showing an extremely preferable squareness, a residual polarization value Pr of approximately 28 μmC/cm$^2$, and an coercive voltage Vc of approximately 15 V.

Figure 8:
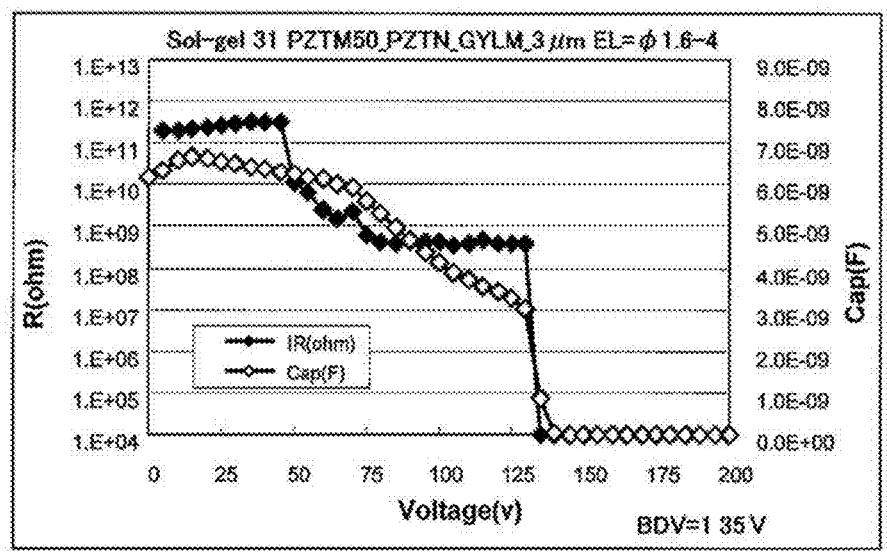
FIG. 8 is a diagram showing a result of leak current density measurement for example 2.

FIG. 8 is a diagram showing a measurement result for a leak current density of example 2.

According to FIG. 8, it has been confirmed that a leak current density characteristic showing an extremely high withstand voltage is obtained, and the breakdown voltage is 135 V.

Figure 9:
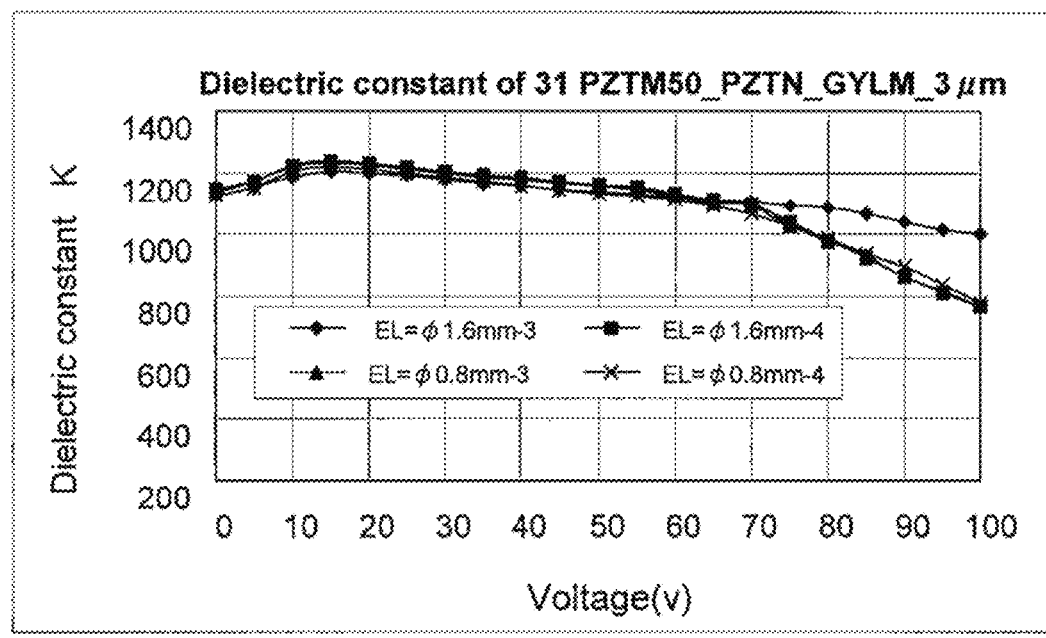
FIG. 9 is a diagram showing a result of relative dielectric constant measurement for example 2.

FIG. 9 is a diagram showing a result when the relative dielectric constant of example 2 is measured under the following measurement condition, and a capacitance value is converted into a dielectric constant by C-V curve evaluation.

[Measurement Condition]

Frequency: 1 kHz

Level: 1 V

Bias: 0 to 100 V

According to FIG. 9, it has been confirmed that the relative dielectric constant ε of example 2 shows an extremely large value of 1,200.

Figure 10:
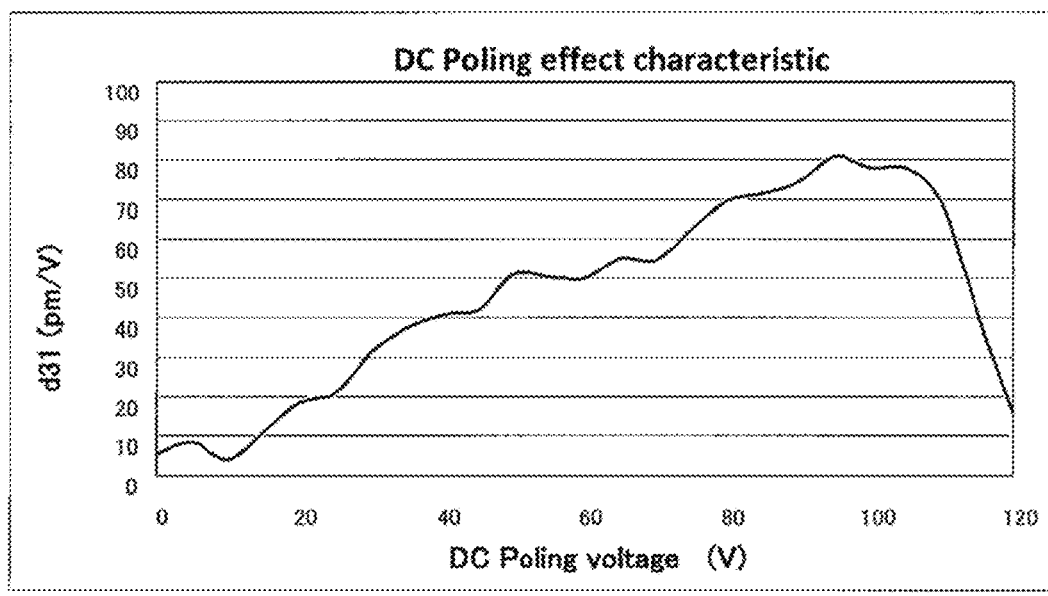
FIG. 10 is a diagram showing an evaluation result of a piezoelectric characteristic d31 of example 2.

FIG. 10 is a diagram showing an evaluation result for a piezoelectric characteristic d31 of example 2.

Here, in a simplified manner, a voltage of 0 to 120 V was applied in every 5V step for 1 sec, and d31 displacement was measured at each voltage application.

Generally, by optimizing piezoelectric poling using parameters of temperature, voltage, and time, it is possible to obtain a higher d31 constant. Here, the evaluation was performed under a simplified poling condition for efficient evaluation.

It is concluded to be a preferable result that a piezoelectric characteristic of d31>80 pm/V was obtained under such a condition.

Example 3

A Pt lower electrode is fabricated over a substrate of 5 nm-TiOx/Si (100) by the use of a DC sputtering apparatus as a film deposition apparatus. A sputtering condition at this time is as follows.

Substrate temperature: 600° C.

Growth pressure: 0.3 Pa

DC power: 200 W

Sputtering gas: Ar

Film deposition time: 4 min

The above deposited Pt lower electrode is a film having a strong orientation only in (111), and this is caused by a strong self orientation property of Pt.

After that, a seed crystal film configured with a Pb(Zr, Ti)$O_3$ film is epitaxially grown over this Pt lower electrode by a sputtering method. A sputtering condition at this time is as follows.

[Sputtering Condition]

Apparatus: RF magnetron sputtering apparatus

Power: 1,500 W

Gas: Ar/$O_2$

Pressure: 0.14 Pa

Temperature: 600° C.

Film deposition rate: 0.63 nm/sec

Film deposition time: 1.3 min

The seed crystal film which is configured with the Pb(Zr, Ti)$O_3$ film having a thickness of 50 nm is formed over the Pt lower electrode by the above epitaxial growth. This seed crystal film has a preferred orientation in (111) and has an extremely preferable crystalline property.

Next, a PZT precursor solution is prepared. The PZT precursor solution is a precursor solution containing a metal compound including some or all the components metals of a PZT crystal and partial polycondensate thereof in an organic solvent, and a solution having a PZT concentration of 25 weight % (Zr/Ti=50/50) and including 20%-excessive Pb.

Next, by coating of the PZT precursor solution over the seed crystal film by the spin coat method, the first layer coating film is formed overlapping this seed crystal film. In detail, the PZT precursor solution of 500 μL is coated over the seed crystal film, spin speed is increased from 0 to 500 rpm in 3 sec, the spin speed is kept at 500 rpm for 5 sec, and then spinning is performed at 1,500 rpm for 20 sec and stopped.

Successively, this coated PZT precursor solution is heated to 250° C. on a hot plate and kept at this temperature for 30 sec to be dried, and, after removal of water, the PZT precursor solution is further heated to 450° C. on the hot plate which is kept at a high temperature, and kept at this temperature for 60 sec for temporary calcination.

The above spin coating, drying, and temporary calcination are repeated five times and a five-layer PZT amorphous film including the ferroelectric material is fabricated.

Successively, the PZT amorphous film after the temporary calcination is kept at 700° C. for 3 min for annealing processing in an oxygen atmosphere of 10 atm by the use of a pressure type lamp annealing apparatus, and thereby PZT crystallization is performed. This crystallized PZT ferroelectric crystal film is a ferroelectric coated-and-sintered crystal film having a perovskite structure, and the thickness is 1.5 μm.

Figure 11:
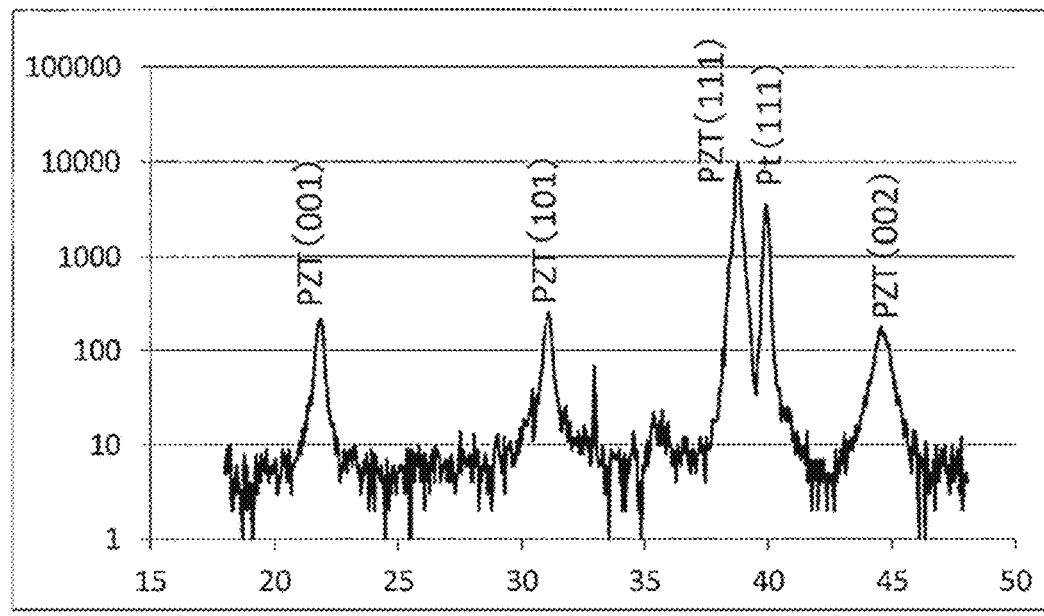
FIG. 11 is a diagram showing a crystalline property evaluation result by XRD diffraction for a PZT ferroelectric crystal film of example 3.
Figure 12:
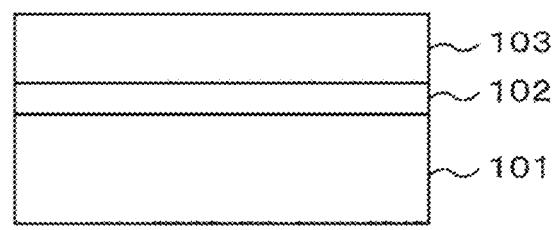
FIG. 12 is a cross-sectional view for explaining a manufacturing method of a conventional ferroelectric crystal film.
Figure 13:
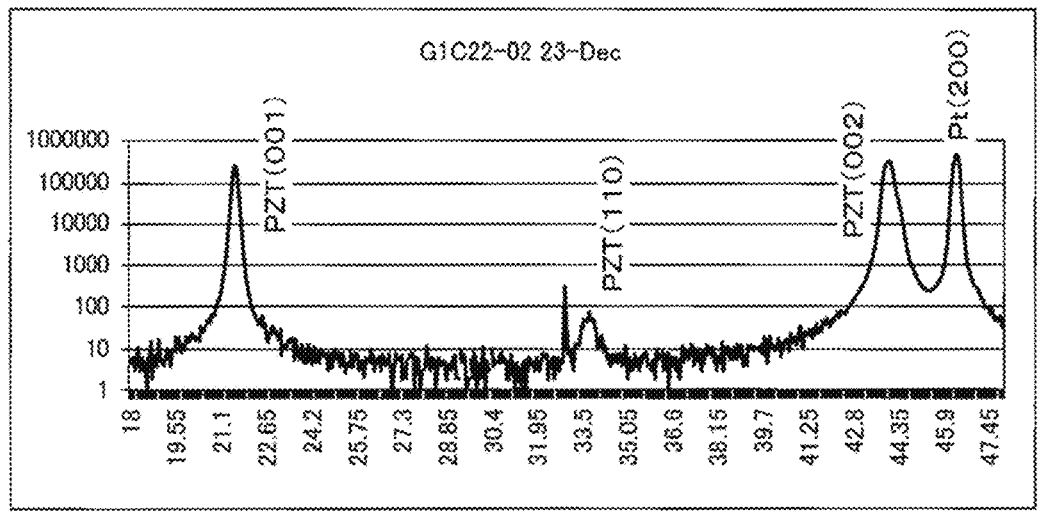
FIG. 13 is a diagram showing a crystalline property evaluation result by XRD diffraction for the PZT film 103 shown in FIG. 12.
Figure 14:
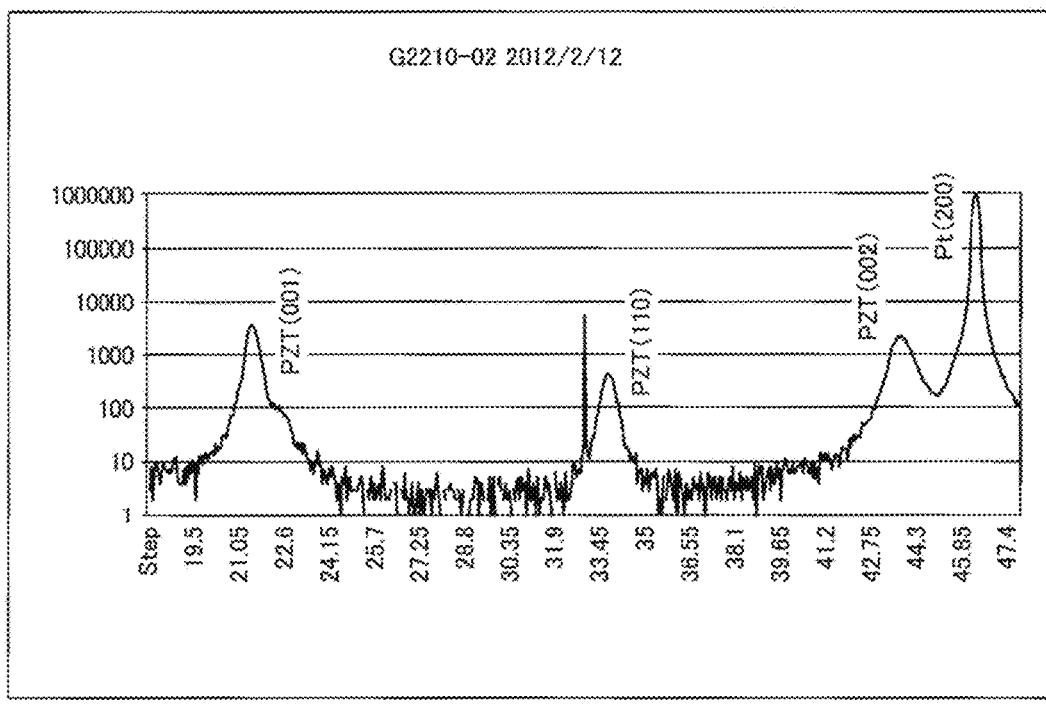
FIG. 14 is a diagram showing a crystalline property evaluation result by XRD diffraction for a PZT crystal film formed by a spin-coat coating method.

FIG. 11 is a diagram showing an XRD pattern which is a result of crystalline property evaluation of the above PZT ferroelectric crystal film by the XRD diffraction. As shown in FIG. 11, it has been confirmed that the PZT ferroelectric crystal film has a preferred orientation in (111) and has an extremely preferable crystalline property.

By study of the composition in the above PZT ferroelectric crystal film, the composition was specified as Pb/Zr/Ti=1.000/0.443/0.443. That is, Pb/Zr/Ti=1.14/0.5/0.5, and it has been found that the film composition is defined almost by the composition of the coating solution (PZT precursor solution).

The invention claimed is:

1. A ferroelectric crystal film, comprising:
a ferroelectric seed crystal film formed on a substrate by a sputtering method and having an orientation in a predetermined face; and
a ferroelectric coated-and-sintered crystal film formed over said ferroelectric seed crystal film by a sol-gel method, wherein
said ferroelectric coated-and-sintered crystal film is formed by a process that a solution, which contains a metal compound including some or all component metals of said ferroelectric coated-and-sintered crystal film and partial polycondensate thereof in an organic solvent, is coated, heated, and crystallized,
each of said ferroelectric seed crystal film and said ferroelectric coated-and-sintered crystal film is a (Pb, A)(Zr, Ti)O$_3$ film, wherein A is at least one element selected from the group consisting of Li and Na, and each ratio in the number of elements for said (Pb, A)(Zr, Ti)O$_3$ film satisfies the following formula (3')

$$1 \leq (Pb+A)/(Zr+Ti) \leq 1.35 \qquad (3').$$

2. The ferroelectric crystal film according to claim 1, wherein
said ferroelectric coated-and-sintered crystal film has an orientation in the same face as said predetermined face.

3. The ferroelectric crystal film according to claim 1, wherein
a Zr/Ti ratio in the number of elements for said (Pb, A)(Zr, Ti)O$_3$ film satisfies the following formula (1):

$$60/40 \geq Zr/Ti \geq 40/60 \qquad (1).$$

4. An electronic component, comprising
said ferroelectric crystal film according to claim 1.

5. A ferroelectric crystal film, comprising:
a ferroelectric seed crystal film formed on a substrate by a sputtering method and having an orientation in a predetermined face; and
a ferroelectric coated-and-sintered crystal film formed over said ferroelectric seed crystal film by a sol-gel method, wherein
said ferroelectric coated-and-sintered crystal film is formed by a process that a solution, which contains a metal compound including some or all component metals of said ferroelectric coated-and-sintered crystal film and partial polycondensate thereof in an organic solvent, is coated, heated, and crystallized,
each of said ferroelectric seed crystal film and said ferroelectric coated-and-sintered crystal film is a (Pb, A)(Zr, Ti)O$_3$ film, wherein A is at least one selected from the group consisting of Li and Na,
said ferroelectric seed crystal film has an orientation in (001), and
said ferroelectric coated-and-sintered crystal film has an orientation in (001).

6. A ferroelectric crystal film, comprising:
a ferroelectric seed crystal film formed on a substrate by a sputtering method and having an orientation in a predetermined face; and
a ferroelectric coated-and-sintered crystal film formed over said ferroelectric seed crystal film by a sol-gel method, wherein
said ferroelectric coated-and-sintered crystal film is formed by a process that a solution, which contains a metal compound including some or all component metals of said ferroelectric coated-and-sintered crystal film and partial polycondensate thereof in an organic solvent, is coated, heated, and crystallized,
each of said ferroelectric seed crystal film and said ferroelectric coated-and-sintered crystal film is a (Pb, A)(Zr, Ti)O$_3$ film, wherein A is at least one selected from the group consisting of Li and Na,
said ferroelectric seed crystal film has an orientation in (111), and
said ferroelectric coated-and-sintered crystal film has an orientation in (111).

* * * * *